(12) United States Patent
Kim et al.

(10) Patent No.: US 7,746,703 B2
(45) Date of Patent: Jun. 29, 2010

(54) FLASH MEMORY DEVICE AND METHOD OF PROGRAMMING FLASH MEMORY DEVICE

(75) Inventors: Kyong-Ae Kim, Suwon-si (KR); Jin-Wook Lee, Seoul (KR); Yun-Ho Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 209 days.

(21) Appl. No.: 12/126,080

(22) Filed: May 23, 2008

(65) Prior Publication Data
US 2009/0003064 A1  Jan. 1, 2009

(30) Foreign Application Priority Data
May 25, 2007   (KR) ...................... 10-2007-0050960

(51) Int. Cl.
  G11C 11/34   (2006.01)
  G11C 16/06   (2006.01)
(52) U.S. Cl. .............................. 365/185.28; 365/185.22
(58) Field of Classification Search ............ 365/185.22, 365/185.28
See application file for complete search history.

(56) References Cited

U.S. PATENT DOCUMENTS

| | | | |
|---|---|---|---|
| 5,473,563 A | 12/1995 | Suh et al. | |
| 5,642,309 A | 6/1997 | Kim et al. | |
| 5,696,717 A | 12/1997 | Koh | |
| 6,266,270 B1 | 7/2001 | Nobukata | |
| 6,282,121 B1 | 8/2001 | Cho et al. | |
| 7,024,598 B2 | 4/2006 | Jeong et al. | |
| 2002/0069381 A1 | 6/2002 | Jeong et al. | |
| 2007/0109862 A1* | 5/2007 | Kim et al. ............. | 365/185.19 |
| 2007/0211537 A1* | 9/2007 | Park et al. ............. | 365/185.22 |
| 2008/0158997 A1* | 7/2008 | Hemink et al. ......... | 365/185.22 |
| 2009/0154250 A1* | 6/2009 | Lin ....................... | 365/185.22 |

FOREIGN PATENT DOCUMENTS

| | | |
|---|---|---|
| JP | 2005-018983 | 1/2005 |
| JP | 2006-048783 | 2/2006 |
| KR | 1020010029546 A | 4/2001 |
| KR | 1020020039744 A | 5/2002 |
| KR | 1020020043378 A | 6/2002 |
| KR | 1020060046437 A | 5/2006 |
| KR | 1020060061085 A | 6/2006 |

* cited by examiner

Primary Examiner—Ly D Pham
(74) Attorney, Agent, or Firm—Volentine & Whitt, P.L.L.C.

(57) ABSTRACT

A flash memory device and a method of programming the same include a memory cell array, a pass/fail check circuit and a control logic circuit. The memory cell array includes multiple memory cells arranged in rows and columns. The pass/fail check circuit verifies whether data bits selected by a column address during a column scan operation have program data values. The control logic circuit detects fail data bits from the selected data bits and stores the column address in response to the verification result of the pass/fail check circuit. The control logic circuit also compares a number of the fail data bits with a reference value and controls generation of the column address according to the comparison result.

25 Claims, 8 Drawing Sheets

Fig. 1

(PRIOR ART)

Fig. 2

(PRIOR ART)

FLASH MEMORY DEVICE AND METHOD OF PROGRAMMING FLASH MEMORY DEVICE

CROSS-REFERENCE TO RELATED APPLICATIONS

A claim of priority is made to Korean Patent Application No. 10-2007-0050960, filed on May 25, 2007, the subject matter of which is hereby incorporated by reference.

BACKGROUND OF THE INVENTION

The present invention relates to a flash memory device, and more particularly, to a flash memory device capable of verifying whether selected data bits have program data values, and a programming method of the flash memory device.

Generally, a flash memory device is a kind of electrically erasable programmable read only memory (EEPROM), in which multiple memory regions are simultaneously erased or programmed in one program operation. Because EEPROM can be electrically erased and programmed, it is extensively employed in system programming or in auxiliary devices, which require continuous updating. Also, because a flash EEPROM (hereinafter, referred to as flash memory) has a higher degree of integration than a typical EEPROM, it is particularly useful in high capacity auxiliary memory devices.

A flash memory device may include a NAND flash memory or a NOR flash memory, according to the structure of the corresponding logic gate used in each storage device. The NAND flash memory device provides a higher degree of integration, as compared to the NOR flash memory device.

Figure 1:
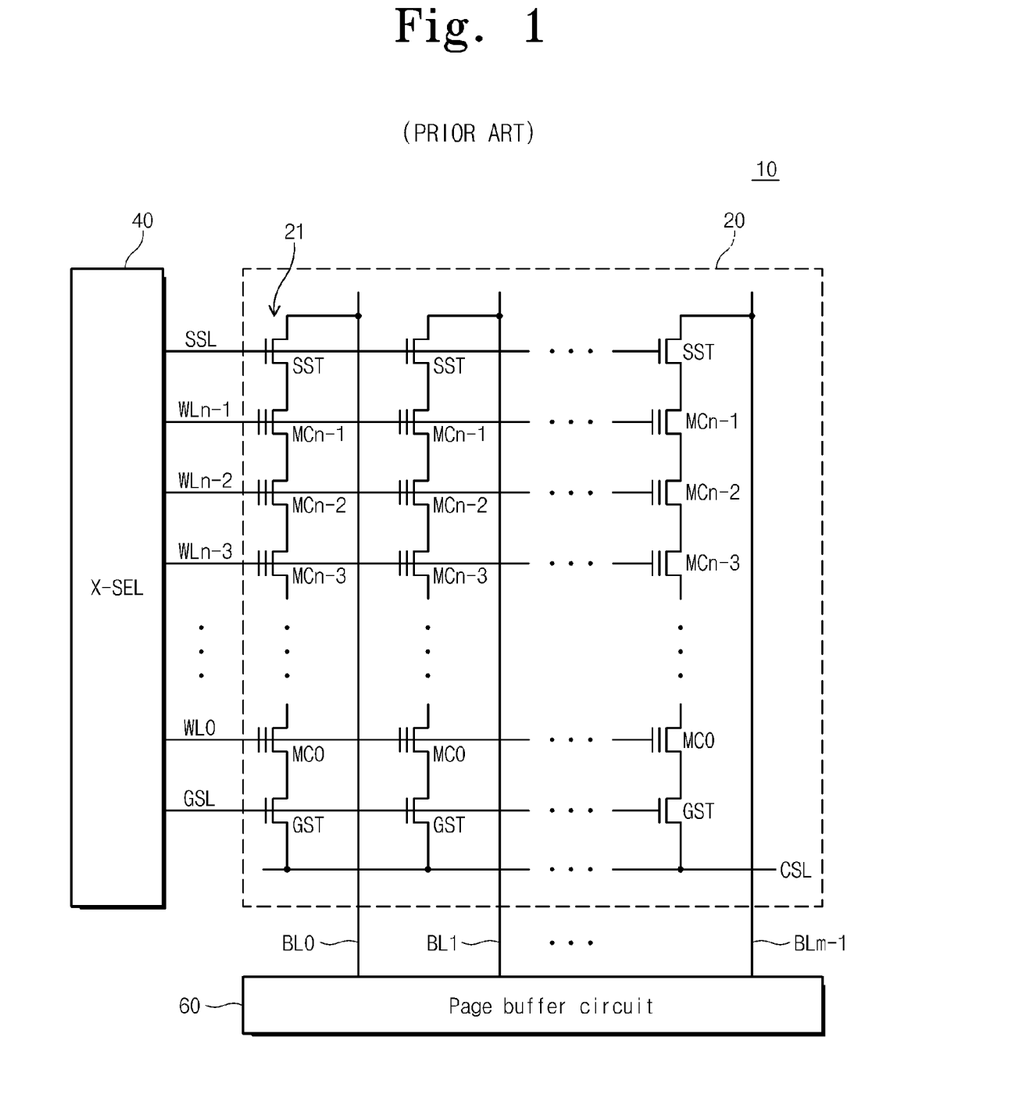
FIG. 1 is a block diagram of a conventional NAND flash memory device.

FIG. 1 is a block diagram of a typical NAND flash memory device.

Referring to FIG. 1, the NAND flash memory device 10 includes a memory cell array 20, a row selection circuit (X-SEL) 40 and a page buffer circuit 60. The memory cell array 20 includes multiple cell strings (i.e., NAND strings) 21 connected to bit lines BL0 to BLm−1, respectively. Each cell string or column includes a string selection transistor SST as a first selection transistor, a ground selection transistor GST as a second selection transistor, and multiple flash EEPROM cells or memory cells MC0 to MCn−1 connected in series between the selection transistors SST and GST.

The string selection transistor SST in each column includes a drain connected to the corresponding bit line and a gate connected to a string selection line SSL. The ground selection transistor GST includes a source connected to a common source line CSL and a gate connected to a ground selection line GSL. The memory cells MC0 to MCn−1 are connected in series between the source of the string selection transistor SST and the drain of the ground selection transistor GST. The cells in each cell string include floating gate transistors. Control gates of the floating gate transistors are connected to corresponding word lines WL0 to WLn−1, respectively.

The string selection line SSL, the word lines WL0 to WLn−1, and the ground selection line GSL are electrically connected to the row selection circuit 40. The row selection circuit 40 selects one of the word lines WL0 to WLn−1 according to row address information, and supplies word line voltages to the selected word line and unselected word lines according to each operating mode. For example, the row selection circuit 40 supplies a program voltage to a word line selected during a program operating mode, and passes voltages to unselected word lines. The row selection circuit 40 supplies a ground voltage GND to a word line selected during a read operating mode. The program voltage, the pass voltage and the read voltage are higher than a power supply voltage.

Bit lines BL0 to BLm−1 in the memory cell array 20 are electrically connected to the page buffer circuit 60. The page buffer circuit 60 detects data from the memory cells of the word line selected through the bit lines BL0 to BLm−1 during a read/verify operating mode. It is determined whether the memory cell is a programmed cell or an erased cell through a detect operation of the page buffer circuit 60. Additionally, the page buffer circuit 60 supplies a power supply voltage (i.e., a program-inhibited voltage) or a ground voltage (i.e., a program voltage) to the bit lines BL0 to BLm−1 during a program operating mode, according to data to be programmed. The page buffer circuit 60 may include page buffers corresponding to bit lines BL0 to BLm−1, respectively. Alternatively, each page buffer may be configured to share a pair of bit lines.

The memory cell of the NAND flash memory 10 is erased and programmed through a Fowler-Nordheim tunneling current. Erasing and programming methods of a NAND flash memory are disclosed, for example, in U.S. Pat. No. 5,473,563 to Suh et al., entitled "Nonvolatile Semiconductor Memory," and in U.S. Pat. No. 5,696,717 to Koh, entitled "Nonvolatile Integrated Circuit Memory Devices Having Adjustable Erase/Program Threshold Voltage Verification Capability."

Additionally, the flash memory device is programmed using incremental step pulse programming (ISPP) in order to accurately control threshold voltage distributions of their memory cells. An exemplary programming method of the flash memory device using the ISPP method is disclosed in U.S. Pat. No. 6,266,270, to Nobukata, entitled "Non-Volatile Semiconductor Memory and Programming Method of the Same." One example of a circuit generating a program voltage according to the ISPP method is disclosed in U.S. Pat. No. 5,642,309, to Kim, et al., entitled "Auto-Program Circuit in a Nonvolatile Semiconductor Memory Device," and in Korean Patent No. 2002-39744 entitled "Flash Memory Device Capable of Preventing Program Disturb and Method of Programming the Same."

During a program operation of the flash memory device 10, data to be programmed are sequentially delivered to the page buffer circuit 60 by a byte or word unit. When the data to be programmed, e.g., one page, are loaded into the page buffer circuit 60, the data in the page buffer circuit 60 are simultaneously programmed into the memory cell array 20 (e.g., memory cells of a selected page), according to a program command.

To program a flash memory device using the ISSP method, a cycle during which data are programmed (hereinafter, referred to as a "program cycle") includes multiple program loops (i.e., "ISSP loops"). Additionally, each ISSP loop is divided into a program loop and a program verify loop. During the program loop, memory cells are programmed under a bias condition according to a typical method. During the program verify loop, it is determined whether memory cells are programmed to a required threshold voltage. Until all the memory cells are programmed within the predetermined number of times, the program loops are repeatedly performed. The program verify operation is essentially the same in the read operation except that read data are not output.

A verify method for determining whether memory cells are programmed to a required threshold voltage includes a wired-OR type method and a column scan type method (also, referred to as a "Y-scan method"). An exemplary memory device using a column scan method is disclosed in U.S. Pat.

No. 6,282,121, to Cho, et al., entitled "Flash Memory Device with Program Status Detection Circuitry and the Method Thereof."

The typical flash memory device 10 further includes a column selection circuit (not shown) and a pass/fail check circuit (not shown). After a program operation, when verifying a program state using the Y-scan method, the column selection circuit selects page buffers of the page buffer circuit 60 by predetermined unit in response to a column address. Data bits of the selected page buffers are transferred to the pass/fail check circuit through the column selection circuit. The pass/fail check circuit determines whether all inputted data bits have program data values. When the memory cells are normally programmed, the data bits have program data values, referred to as "program pass." In this case, the column address is incrementally increased (increased by one column address), and the incremented column address is provided into the column selection circuit. Following data values are selected by the counted-up column address.

When the memory cells are programmed abnormally, data bits of the memory cells do not have program data values, referred to as "program fail." In this case, the flash memory device terminates the Y-scan operation, and increases a program voltage by a predetermined level through the ISSP method after storing the column address. Then, the flash memory device performs the programming operation again. After the repeated programming operation, the flash memory device again performs the Y-scan operation starting from the stored column address. This program verify operation repeats until the failed cells are normally programmed, and also until all the memory cells of the selected page are selected, i.e., the last column address is generated.

Figure 2:
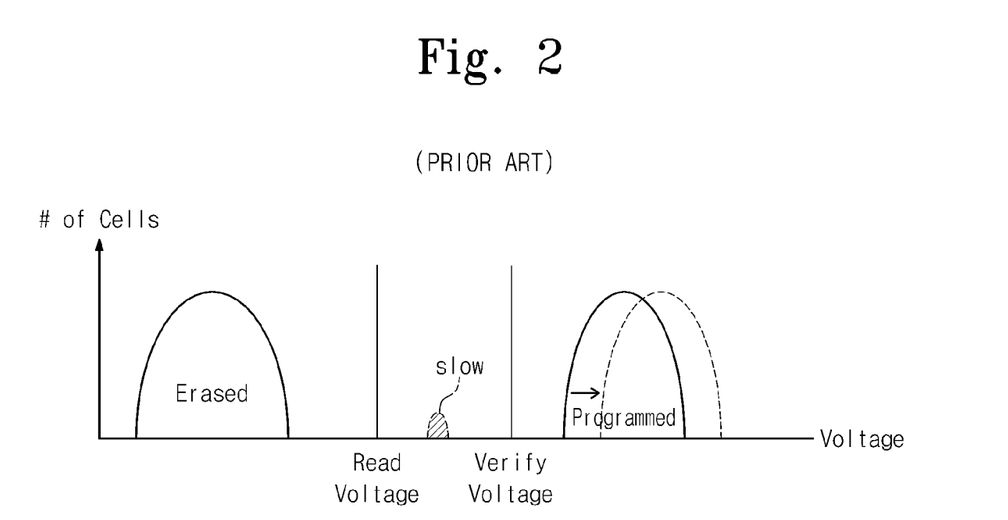
FIG. 2 is a graph illustrating changes of a threshold voltage distribution of a flash memory device programmed according to an ISPP method.

FIG. 2 is a graph illustrating changes of a threshold voltage distribution of a conventional flash memory device programmed according to an ISPP method.

Referring to FIG. 2, the typical flash memory device performs program operations according to the ISPP method in order to raise a threshold voltage of a cell in an erased state higher than a verify voltage with respect to a read voltage. When using the ISPP method, threshold voltage distribution of the cell overlaps that of the normally-programmed cell. When it is determined that all of the cells to be programmed are normally programmed during a program verify operation, the flash memory device finishes a verify operation and terminates a program. The threshold voltage distribution of the normally-programmed cells is higher than the verify voltage, as illustrated in FIG. 2.

However, there may be some cells that do not have a voltage higher than the verify voltage during the program operation. These cells are not normally programmed and may be referred to as "slow cells" or "fail bit cells." As illustrated in FIG. 2, the threshold voltage distribution of the slow cell (hereinafter, referred to as the "fail bit cell") is lower than the verify voltage.

When performing a verify operation through the Y-scan method, the flash memory device terminates the Y-scan operation and stores a column address when there is a fail bit cell. Then, the flash memory device raises the program voltage by a predetermined level and performs the program operation again. After performing the program operation, the flash memory device performs the Y-scan operation starting from the stored column address. This operation repeats until all fail bit cells are normally programmed, and the program voltage incrementally increases each time the operation repeats. As a result, the number of program loops increases, and a program time for the flash memory device increases. Additionally, an unnecessary program voltage is applied to the normally-programmed cells due to the repeating program loops, causing unnecessary stress to the normally-programmed cells. Due to this stress, the threshold voltage distribution of the normally-programmed cells may shift in the direction of the arrow illustrated in FIG. 2, resulting in decreased reliability of the programmed cell.

Consequently, program performance deteriorates because the flash memory device repeatedly performs program loops in order to normally program a few fail bit cells.

SUMMARY OF THE INVENTION

The present invention provides a flash memory device capable of improving program performance and a programming method thereof.

Embodiments of the present invention provide a flash memory device including a memory cell array, a pass/fail check circuit and a control logic circuit. The memory cell array includes multiple memory cells arranged in rows and columns. The pass/fail check circuit verifies whether data bits selected by a column address during a column scan operation have program data values. The control logic circuit detects fail data bits from the selected data bits and stores the column address in response to the verification result of the pass/fail check circuit. The control logic circuit also compares a number of the fail data bits with a reference value and controls generation of the column address according to the comparison result.

The flash memory device may further include an address generator for generating the column address in response to the control logic circuit. The address generator provides the column address to the control logic circuit.

Data may be programmed in the memory cell array during a program operation according to an incremental step pulse programming (ISPP) method. A program operation of a next program loop may start substantially simultaneously with the column scan operation.

In some embodiments, the control logic circuit of the flash memory device may include a fail data bit detector, a program controller and an address store circuit. The fail data bit detector detects the fail data bits from the selected data bits and counts the number of the detected fail data bits. The program controller controls the address generator in response to the verification result of the pass/fail check circuit and the number of the fail data bits of the fail data bit detector. The address store circuit stores the column address provided from the address generator under control of the program controller.

The pass/fail check circuit may output a pass signal as the verification result when all the selected data bits are program pass. Also, the memory controller may control the address generator to incrementally increase the column address in response to the pass signal.

The pass/fail check circuit may output a fail signal as the verification result when program fail data are detected from the selected data bits. Further, the program controller may control the address store circuit to store a column address provided by the address generator in response to the fail signal during a column scan operation when a first fail signal is received from the pass/fail check circuit.

The program controller may control the address generator to incrementally increase the column address when the number of the fail data bits is less than the predetermined reference value.

When the number of the fail data bits is larger than the reference value, the column scan operation may be stopped. The program controller may control the fail data bit detector to initialize the number of the fail data bits when the number of the fail data bits is larger than the reference value. Also, the address store circuit may provide a stored column address to the address generator when the number of the fail data bits is larger than the reference value. The address generator may generate a column address starting from the provided column address after the program operation of a next loop.

The reference value may be based on a number of error bits that can be corrected by an error correction circuit in a flash memory controller controlling the flash memory device. The reference value may be further based on a test for cells in advance and is set below the number of error bits that can be corrected in the error correction circuit.

Other embodiments of the present invention provide a programming method of a flash memory device having a memory cell array, which includes memory cells in rows and columns. The programming method includes performing a program operation; selecting the programmed data by a predetermined unit in response to a column address; verifying whether all the selected data bits have program data values; and comparing a number of fail data bits among the selected data bits with a reference value. Generation of the column address is controlled according to the verifying result and/or the comparing result.

Selecting the programmed data, verifying the selected data bits, and comparing the number of the fail data bits may constitute a column scan operation. Accordingly, the method may further include starting a program operation of a next loop together with the column scan operation.

In some embodiments, comparing the number of the fail data bits may include increasing the column address when all the selected data bits have the program data values. Also, comparing the number of the fail data bits may include increasing the column address when the number of the fail data bits is below the reference value.

In other embodiments, comparing the number of the fail data bits may include storing the column address when the verified result represents a first fail state. Comparing the number of the fail data bits may further includes stopping the column scan operation and generating a column address starting from the stored column address when the number of the fail data bits is above the reference value. Also, comparing the number of the fail data bits may further include initializing the number of the fail data bits when the number of the fail data bits is larger than the reference value.

The reference value may be based on a number of error bits that can be corrected by an error correction circuit in a flash memory controller controlling the flash memory device. The reference value may further be based on a test for cells in advance and is set below the number of error bits that can be corrected in the error correction circuit.

Other embodiments of the present invention provide a flash memory system including a flash memory device and a flash memory controller for controlling the flash memory device. The flash memory controller includes an error correction circuit for correcting an error bit during a read operation. The flash memory device may include a memory cell array having multiple memory cells arranged in rows and columns; a pass/fail check circuit for verifying whether data bits selected by a column address during a column scan operation have program data values; and a control logic circuit for detecting fail data bits from the selected data bits and storing the column address in response to the verification result of the pass/fail check circuit. The control logic circuit also compares a number of the fail data bits with a reference value and controls generation of the column address according to the comparison result.

Other embodiments of the present invention provide a computing system including a host and a flash memory system, as described above. The flash memory system provides data to the host during a read operation.

BRIEF DESCRIPTION OF THE FIGURES

The accompanying drawings provide further understanding of embodiments of the present invention. The embodiments of the present invention will be described with reference to the attached drawings, in which.

DETAILED DESCRIPTION OF THE EMBODIMENTS

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

According to various embodiments of the present invention, a flash memory device includes a memory cell array, a pass/fail check circuit and a control logic circuit. The memory cell array includes memory cells arranged in rows and columns. The pass/fail check circuit verifies whether data bits selected by a column address have program data values during a column scan operation. The control logic circuit detects fail data bits from the selected data bits and stores the column address in response to the verified result of the pass/fail check circuit. The control logic circuit also compares the number of the fail data bits with a reference value and controls generation of the column address according to the compared result. The flash memory device thus does not repeatedly perform a program loop in order to normally program fail bit cells when there are few fail bit cells, reducing program time for the flash memory device and stress on the normally-programmed cells. As a result, the flash memory device can improve program performance.

Figure 3:
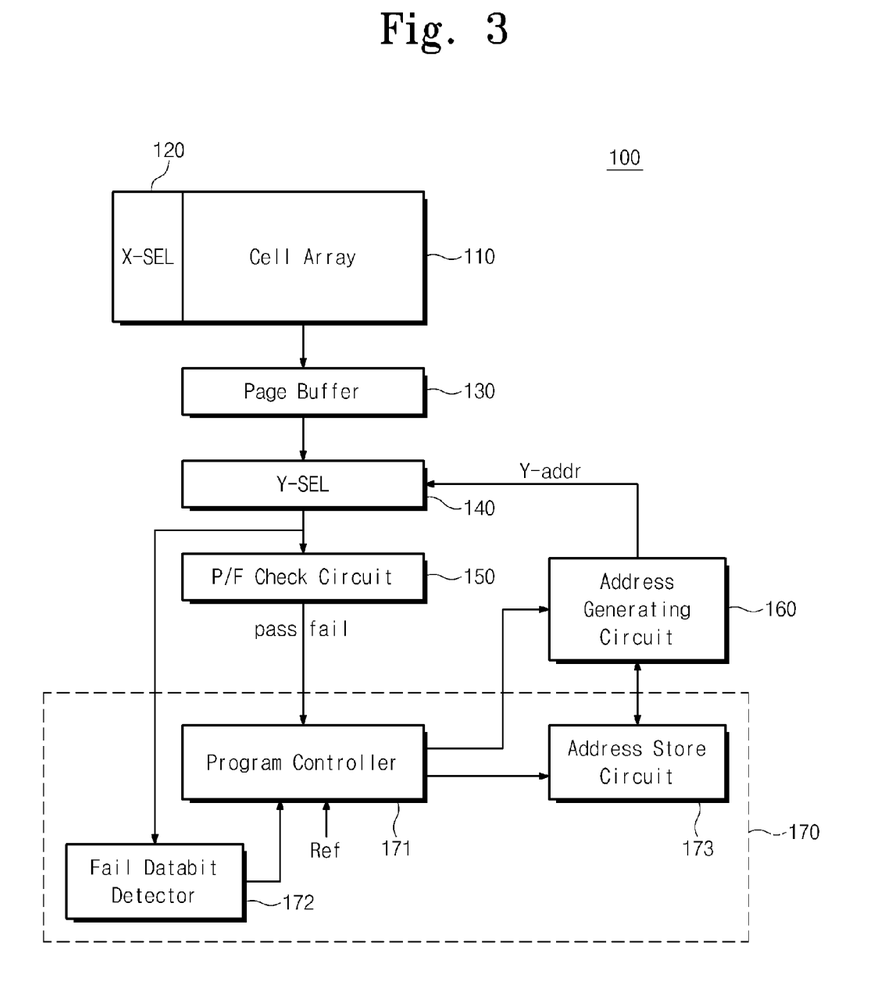
FIG. 3 is a block diagram of a flash memory device, according to an exemplary embodiment of the present invention.

FIG. 3 is a block diagram of a flash memory device 100, according to an illustrative embodiment of the present invention.

Referring to FIG. 3, the flash memory device 100 includes a memory cell array 110, a row selection circuit 120, a page buffer circuit 130, a column selection circuit 140, a pass/fail check circuit 150, an address generating circuit 160 and a control logic circuit 170. The control logic circuit 170 includes a program controller 171, a fail data bit detector 172 and an address store circuit 173. The memory cell array 110, the row selection circuit 120 and the page buffer circuit 130 may be substantially the same as those discussed above with respect to FIG. 1, and therefore overlapping description will not be repeated for conciseness.

The column selection circuit 140 selects page buffers of the page buffer circuit 130 by predetermined unit in response to a column address Y-addr provided from the address generating circuit 160. During a program verify operation, data bits of the selected page buffers are transferred to the pass/fail check circuit 150 and the control logic circuit 170 through the column selection circuit 140. The pass/fail check circuit 150 verifies whether all the input data bits have program data values and provides the verified result to the control logic circuit 170. The control logic check circuit 170 detects the number of fail data bits from the input data bits, and controls program and program verify operations in response to the detected the verified result provided by the pass/fail check circuit 150, as well as the number of fail data bits.

More particularly, the program controller 171 of the control logic circuit 170 receives the verified result from the pass/fail check circuit 150, and controls the address store circuit 173 to store the column address Y-addr provided by the address generating circuit 160 in response to the verified result. The fail data bit detector 172 of the control logic circuit 170 detects the number of fail data bits from the data bits provided through the column selection circuit 140, and provides the number of detected fail data bits to the program controller 171. The program controller 171 compares the number of fail data bits from the fail data bit detector 172 with a stored reference value Ref. The program controller 171 controls the address generating circuit 160 and the address store circuit 173 according to the results of the comparison.

The address generating circuit 160 sequentially generates or holds the column address Y-addr according to control of the control logic circuit 170. The generated column address Y-addr is provided to the column selection circuit 140 and the address store circuit 173.

According to this structure, when there are fail bit cells, the flash memory device 100 does not repeatedly perform a program loop for normally programming the fail bit cells, according to the incremental step pulse programming (ISPP) method. Accordingly, a program time for the flash memory device is reduced, and stress on the normally-programmed cells is also decreased. As a result, the flash memory device 100 improves program performance.

Figure 4:
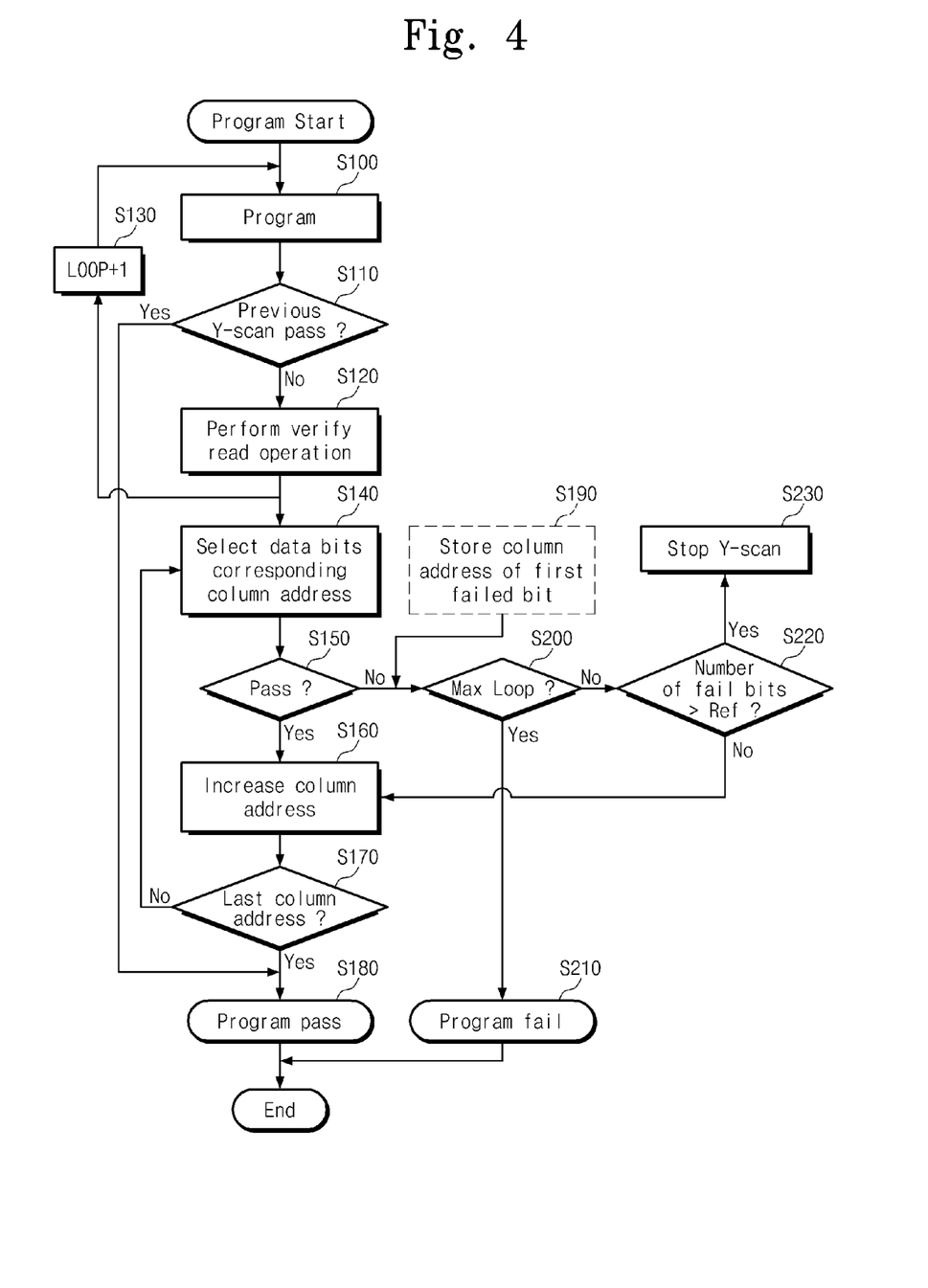
FIG. 4 is a flowchart illustrating program and program verify operations of a flash memory device, according to an exemplary embodiment of the present invention.

FIG. 4 is a flowchart illustrating program and program verify operations of a flash memory device, according to an illustrative embodiment of the present invention.

Referring to FIGS. 3 and 4, program and program verify operations (hereinafter, referred to as Y-scan operations) of the flash memory device 100, according to a Y-scan method will be described below.

The flash memory device 100 performs a program operation using the ISPP method in operation S100. Operation S110 determines the result of a previous Y-scan operation. When the result of the previous Y-scan operation is "pass" (S110: Yes), it is determined that the program operation is successful in operation S180. When the Y-scan operation is "fail" (S110: No), a verify read operation is performed in operation S120. In other words, because the Y-scan operation is not performed during the first program operation, the flash memory device 100 performs a verify read operation S120 according to an initialization value (i.e., a fail status).

During the verify read operation in operation S120, the page buffer 130 detects data bits stored in memory cells of the cell array 110. The flash memory device 100 increases the program loop by one in operation S130, and performs the Y-scan operation after the verify read operation of operation S120. Accordingly, the program operation of the next loop is performed together with the Y-scan operation. Operations of the flash memory device 100 will be described in more detail.

The column address Y-addr generated in the address generating circuit 160 is provided to the column selection circuit 140 and the address store circuit 173. The column address Y-addr provided to the address store circuit 173 is stored according to the verified result of the data bits selected by the column address Y-addr, which will be described in more detail below.

During the Y-scan operation, the column selection circuit 140 selects page buffers of the page buffer circuit 130 by a predetermined unit in response to the column address Y-addr in operation S140. The data bits of the page buffers selected by the column selection circuit 140 in operation S140 are provided to the pass/fail check circuit 150 and the fail data bit detector 172 of the control logic circuit 170 through the column selection circuit 140.

In operation S150, the pass/fail check circuit 150 performs a verify operation on the selected data bits. The pass/fail check circuit 150 outputs a pass signal (S150: Yes) when all the input data bits have program data values. The data that have program data values are called "program pass data." However, the pass/fail check circuit 150 outputs a fail signal (S150: No) when data that do not have program data values are detected from the input data bits. The data without program data values are called "program fail data." The pass signal indicates that all the selected cells are normally programmed, and the fail signal indicates that there may be cells that are not normally programmed.

The fail data bit detector 172 of the control logic circuit 170 detects fail data bits from the data bits provided through the column selection circuit 140. Additionally, the fail data bit detector 172 counts the number of fail data bits, which is provided to the program controller 171. Therefore, when the pass signal is output from the pass/fail check circuit 150, it indicates that no fail data bits have been detected. When the fail signal is output from the pass/fail check circuit 150, it indicates that fail data bits have been detected and the fail data bit detector 172 determines the number of fail data bits.

When the verified result is pass in operation S150 (S150: Yes), the column address Y-addr is incrementally increased in operation S160, and it is determined whether the incremented column address Y-addr is the last column address in operation S170. When the column address Y-addr is not the last one (S170: No), the program and program verify operations return to operation S140. In operation S140, data bits corresponding to the incremented column address Y-addr are selected.

Also, when the verified result of the pass/fail check circuit 150 is pass, the program controller 171 of the control logic circuit 170 receives a pass signal from the pass/fail check circuit 150. The program controller 171 controls the address store circuit 173 not to store the column address Y-addr provided from the address generating circuit 160 in response to the pass signal. Additionally, the program controller 171 controls the address generating circuit 160 in response to the pass signal. At this point, the address generating circuit 160 incrementally increases the column address (e.g., increases a column address by one) under control of the program controller 171.

As stated above, in operation S170, when the incremented column address is not the last column address, the program and program verify operations return to operation S140. That is, the incremented column address Y-addr is provided to the column selection circuit 140 and the address store circuit 173. Accordingly, the next data bits are selected according to the incremented column address Y-addr, and the flash memory device 100 continuously performs the Y-scan operation. The column address Y-addr is incrementally increased up to the last column address. The incremented address Y-addr provided to the address store circuit 173 is stored according the verified result of the data bits selected by the incremented column address Y-addr.

Returning to operation S150, when the verified result of the pass/fail check circuit 150 is fail (S150: No), the program controller 171 of the control logic circuit 170 receives a fail signal from the pass/fail check circuit 150. The program controller 171 then controls the address store circuit 173 to store the column address Y-addr provided from the address generating circuit 160 in operation S190 when the input fail signal is the first input fail signal during the Y-scan operation. When the input fail signal is not the first input fail signal, the column address Y-addr provided from the address generating circuit 160 is not stored in the address store circuit 173.

Further, when the verified result of the pass/fail check circuit 150 is fail, it is determined whether the number of program loops has reached a maximum number of program loops in operation S200. In the case where fail cells are not normally programmed after a program operation is performed with the last program loop through the ISPP method, the fail cell is no longer programmed. Accordingly, when the number of program loops reaches the maximum number of program loops (S200: Yes), it is determined that the program has failed at operation S210, and program and program verify operations are terminated. When the number of program loops has not reached the maximum number of program loops (S200: No), the program and program verify operations proceed to operation S220.

In operation S220, the program controller 171 compares the number of fail data bits provided from the fail data bit detector 172 with a previously stored reference value Ref. For purposes of discussion, the reference value Ref is set to three, for example, and the Y-scan operation will be described in more detail, accordingly. However, it is understood that the reference value Ref may vary.

When the number of fail data bits is less than the reference value Ref (S220: No), the program and program verify operations proceed to operation S160. In other words, the program controller 171 controls the address generating circuit 160 to incrementally increase the column address Y-addr when the number of the input fail bits is less than the reference value Ref.

The address generating circuit 160 provides the incremented column address Y-addr to the column selection circuit 140 and the address store circuit 173. Accordingly, the predetermined next data bits are selected by the incremented column address in operation S140, and the flash memory device 100 continuously performs the Y-scan operation.

For example, assuming the reference value Ref is three, the program controller 171 receives a first fail signal during the Y-scan operation. The fail data bit detector 172 detects two fail bits. The address store circuit 173 stores the column address Y-addr provided from the address generating circuit 160 under control of the program controller 171.

At this point, the program controller 171 compares the reference value Ref with the number of fail data bits input from the fail data bit detector 172. Because the number of the fail data bits is less than the reference value Ref, the program controller 171 controls the address generating circuit 160 to increase the column address Y-addr. As the column address Y-addr increases, the next predetermined data bits are selected, and each time the selected data bits are verified, the fail data bit detector 172 detects the number of fail data bits.

The program controller 171 controls the address generating circuit 160 as described above until the number of fail data bits input from the fail data bit detector 172 is greater than the reference value Ref (e.g., three). Accordingly, the flash memory device 100 does not perform a program loop repeatedly in order to normally program a few fail data bit cells (e.g., three fail bits).

When the number of fail data bits detected in the fail data bit detector 172 is four, for example, the number of fail data bits is determined to be larger than the predetermined reference value at step S220. In this case, the Y-scan operation is stopped in operation S230. Accordingly, the program controller 171 controls the address generating circuit 160 not to increase the column address Y-addr.

Additionally, the address store circuit 173 provides the column address Y-addr, which is stored when the first fail signal is input under control of the program controller 171, to the address generating circuit 160. That is, the column address Y-addr where the first fail data bit occurs is provided to the address generating circuit 160. At this point, the fail data bit detector 172 initializes the number of fail data bits, which is counted as four under control of the program controller 171. At this point, referring to operations S100 through S130, the flash memory device 100 has already performed the program operation of the next loop. Additionally, because the result of the Y-scan operation is fail, as described above, the flash memory device 100 increases the program loop in operation S130 and performs the Y-scan operation again after the verify read operation in operation S120.

Since the address generating circuit 160 generates a new column address again starting from the input column address Y-addr, the column address Y-addr is provided to the column selection circuit 140 and the address store circuit 173. Accordingly, the Y-scan operation starts from the column address Y-addr where the first fail data bit occurs. Thereafter, the Y-scan operation according to the Y-scan method is the same as before. That is, the number of fail data bits is detected again, and the column address of when the first fail signal is inputted is stored. Additionally, the number of the fail data bits is compared with the reference value Ref, and the program and Y-scan operations are controlled according to the compared result.

Consequently, the flash memory device 100 stores the column address Y-addr where the first fail bit occurs and performs the Y-scan operation like a pass state when the number of fail bit cells is less than the reference value Ref. Thus, the flash memory device 100 does not need to repeatedly perform a program loop according to the ISPP method in order to normally program a few fail bit cells. Accordingly, a program time for the flash memory device and stress on the normally-programmed cells are decreased. As a result, the flash memory device can improve program performance.

In an embodiment, the program controller 171 receives the reference value Ref from an error correction circuit or error correction code (ECC) (not shown in FIG. 3) of a flash memory controller (not shown in FIG. 3). The program controller 171 stores the provided reference value Ref. The reference value can be determined by a test, which is described in more detail, below. The reference value Ref determined by the test is stored in the program controller 171 in advance.

During a read operation, the error correction circuit detects failed data bits (or error bits) from the read data bits, and then corrects the detected error bits. At this point, the number of error bits, which can be detected and corrected by the error correction circuit, is set. The reference value Ref is the number of bits that can be corrected in the error correction circuit.

As previously stated, the reference value Ref may be determined by the test. In particular, the determined reference value does not exceed the number of error bits that can be corrected in the error correction circuit. For example, in the case where the error correction circuit can correct three error bits and two error bits occur through the test, the reference value is set to two. However, when five error bits occur through the test, the reference value Ref is three.

Again referring to operations S100 through S130 of FIG. 4, the flash memory device 100 performs the Y-scan operation and program operation of the next loop according to the ISPP method simultaneously in order to compensate for the time loss that may occur through the Y-scan operation, as described in more detail, below.

Figure 5:
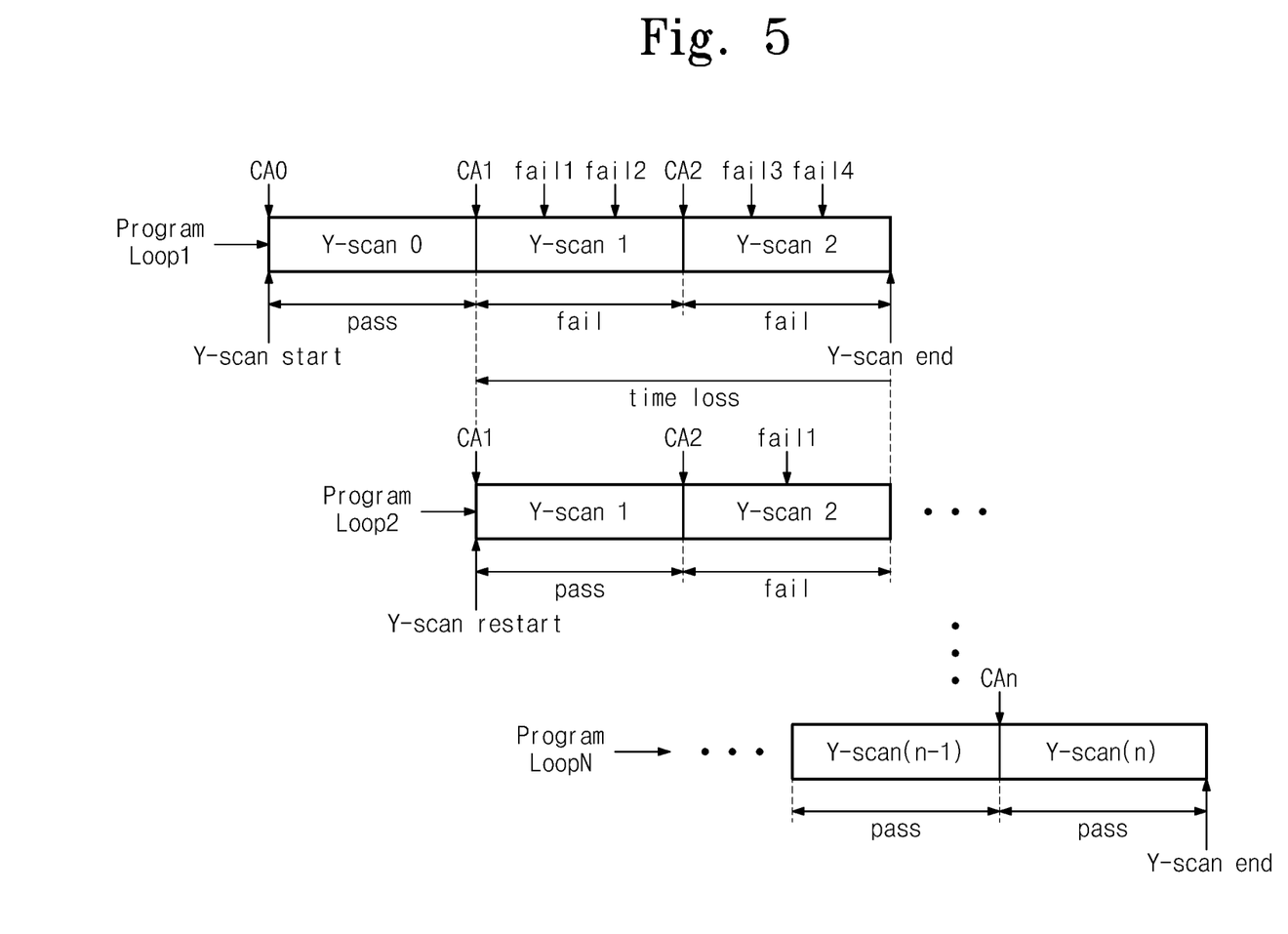
FIG. 5 depicts a flow of a column-scan operation, according to an exemplary embodiment of the present invention.

FIG. 5 is a flow diagram showing a column-scan operation, according to an illustrative embodiment of the present invention.

Referring to FIG. 5, the flash memory device 100 starts the Y-scan operation after the program operation Program Loop1. Y-scan operation Y-scan0 is performed on data bits selected by a first column address CA0 generated in the address generating circuit 160. As illustrated in FIG. 5, it is verified as pass through the Y-scan operation Y-scan0 that the data bits have program data values. Accordingly, the next data bits are selected by the incremented column address CA1, as described above. The selected data bits are verified again by Y-scan operation Y-scan1. As illustrated in FIG. 5, because fail data bits fail1 and fail2 are detected by the Y-scan operation Y-scan1, the pass/fail check circuit 150 outputs a fail signal Fail. At this point, the output fail signal Fail, which is first generated during a column scan operation of the program operation Program Loop1. Accordingly, the column address CA1 where the first fail bit is detected is stored in the address generating circuit 173 under control of the program controller 171. The fail data bit detector 172 provides the number of the detected fail data bits to the program controller 171.

When the assumed reference value Ref is three, for example, the number of fail data bits is less than the predetermined reference value Ref. Accordingly, the column address CA1 is incrementally increased, as described above.

The data bits selected by the incrementally increased column address CA2 are verified by a Y-scan operation Y-scan2. At this point, as illustrated in FIG. 5, because the fail data bits fail3 and fail4 are detected by the Y-scan operation Y-scan2, the pass/fail check circuit 150 outputs a fail signal Fail. At this point, because the output fail signal Fail is not the first fail signal generated during the column scan operation of the program operation Program Loop1, the column address CA2 is not stored in the address store circuit 173. Since the fail data bit detector 172 detects two fail data bits, the total number of detected fail data bits in the program operation Program Loop1 is now four. The number of the fail data bits, counted as four, is provided to the program controller 171.

The number of fail data bits is now larger than the reference value Ref. Accordingly, as described above with respect to FIG. 4, the Y-scan operation is stopped and the column address CA1 stored in the address store circuit 173 is provided to the address generating circuit 160 under control of the program controller 171. At this point, the fail data bit detector 172 initializes the number of fail data bits that is counted as four under control of the program controller 171. Accordingly, the program operation Program Loop2 is performed by a program voltage that is increased by a predetermined level through the ISSP method after the Y-scan operation is stopped. Since the address generating circuit 160 generates a column address starting from the input column address CA1, the column address CA1 is provided to the column selection circuit 140 and the address store circuit 173. Accordingly, the Y-scan operation (i.e., Y-scan restart) on the program operation Program Loop2 starts from the column address where the first fail data bit occurs. Then, the Y-scan operation is performed as described above.

At this point, because the Y-scan operation Y-scan2 performed on the column address CA2 starts from the column address CA1, a time for a program operation of the flash memory device 100 increases, causing time loss.

Figure 6:
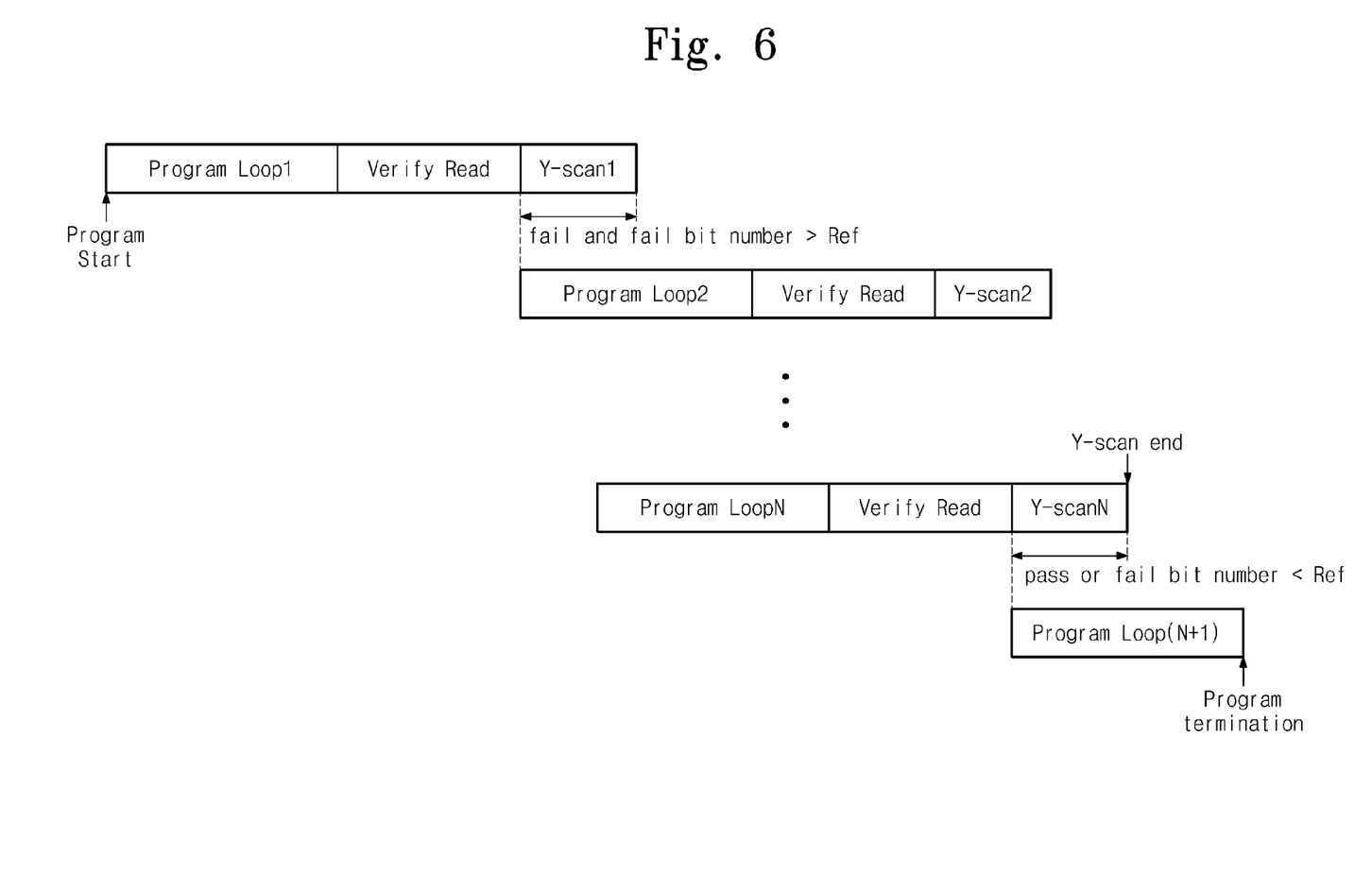
FIGS. 6 and 7 depict flows of program and column-scan operations to compensate for time loss during a column-scan operation of FIG. 5, according to exemplary embodiments of the present invention.
Figure 7:
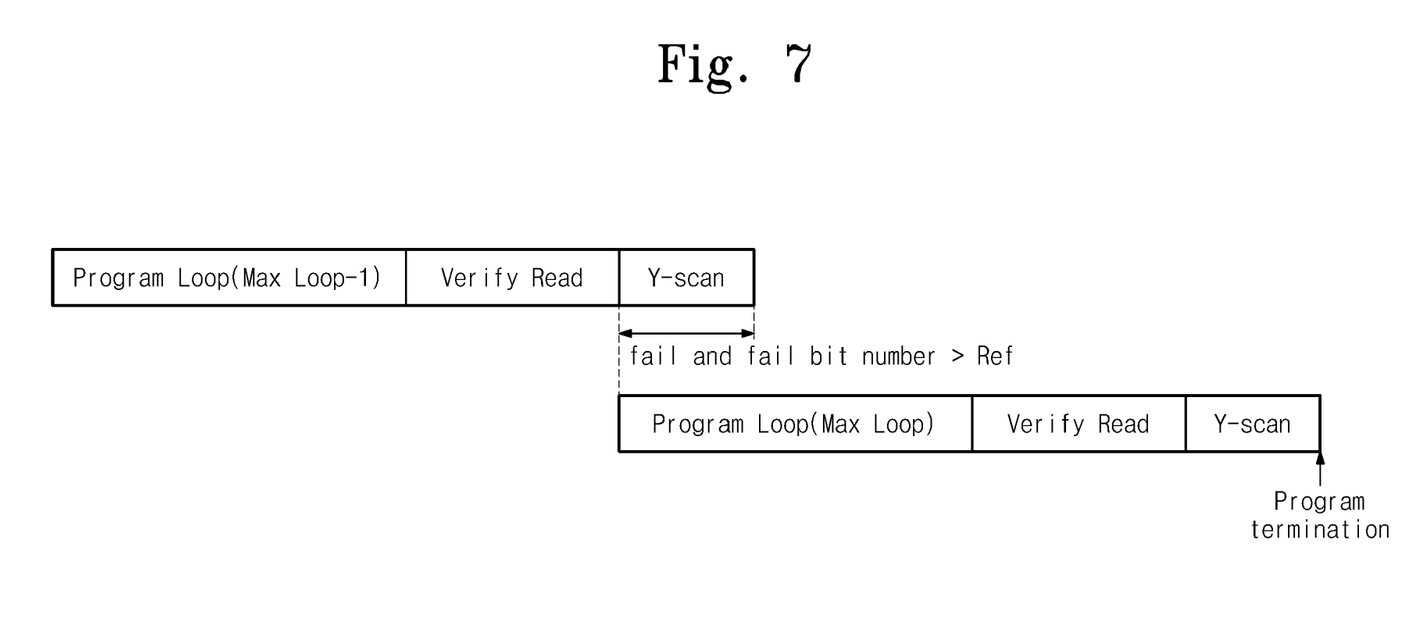

FIGS. 6 and 7 are flow diagrams of program and column-scan operations, according to illustrative embodiments of the present invention, compensating for time loss, which may be incurred during a column-scan operation shown in FIG. 5.

Referring to FIG. 6, the flash memory device 100 performs program operations Program Loop1 to Program Loop(n+1) according to the ISPP method, and performs a verify read operation for program verification. The verify read operation detects the programmed data in the page buffers. The data bits detected in the page buffers through the verify read operation are verified by the Y-scan operation. At this point, the column scan operation and the program operation of the next step are performed simultaneously with the Y-scan operation.

For example, after the program operation Program Loop1 and the verify read operation of the first loop are performed, the Y-scan operation Y-scan1 is performed. Referring to operations S110 through S130 of FIG. 4, the initialization value of the Y-scan operation is set to fail. Accordingly, the program operation Program Loop2 of the second loop is performed during the Y-scan operation Y-scan1.

The Y-scan operation Y-scan1 is stopped when the number of the detected fail data bits exceeds the reference value Ref and the verified result of the Y-scan operation Y-scan1 is fail. Next, the Y-scan operation Y-scan2 is performed starting from the column address where the first fail data bit occurs.

The flash memory device 100 does not perform a program operation Program Loop2 of the next loop after the Y-scan operation Y-scan1, and the program operation Program Loop2 of the next loop starts simultaneously when the Y-scan operation Y-scan1 starts. Accordingly, the Y-scan operation Y-scan2 can start sooner, which reduces time loss of the flash memory device 100, as shown in FIG. 5.

When all the data bits verified by the Y-scan operation pass, or the number of fail data bits is less than the reference value, the program is terminated when the program operation Program Loop (N+1) of the next loop is terminated. In this case, the programming is successful.

Referring to FIG. 7, after the program operation reaches the maximum loop Max Loop, when performing the Y-scan operation, there is no program operation of a program loop that increases a program voltage by a predetermined level. In this case, the program loop does not increase and only the Y-scan operation Y-scan is performed after the program operation of the maximum loop Max Loop.

At this point, when the verified result is fail through the Y-scan operation, there are no more executable program operations of the program loop. Accordingly, the program is terminated, regardless of the compared result of the number of detected fail bits and the reference value. In this case, the programming has failed.

Figure 8:
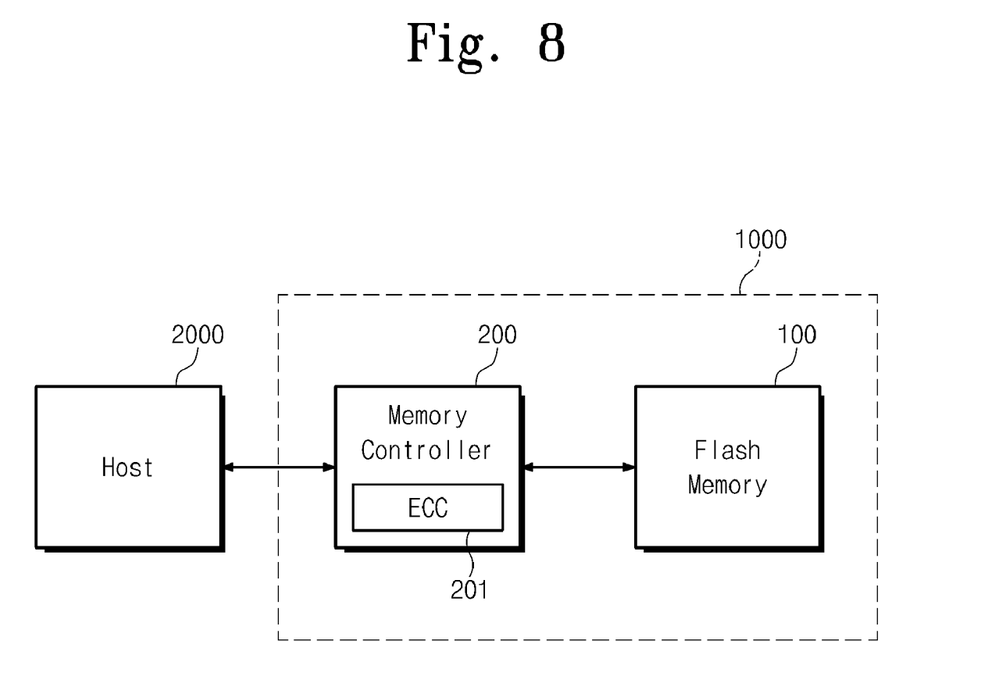
FIG. 8 is a block diagram illustrating a flash memory system with a flash memory device, according to an exemplary embodiment of the present invention.

FIG. 8 is a block diagram illustrating a flash memory system including a flash memory device, according to an illustrative embodiment of the present invention.

Referring to FIG. 8, a flash memory system 1000 includes the flash memory device 100 and a flash memory controller 200, which controls the flash memory device 100. The flash memory controller 200 includes an error correction circuit 201. Since functions of the error correction circuit 201 are described above, its description will not be repeated for conciseness.

The flash memory device 100 verifies data programmed by the program verify operation. At this point, because the number of fail data bits is below the reference value Ref, the program is terminated successfully.

During a read operation, the data programmed in the flash memory device 100 are provided to an external host 2000 through the flash memory controller 200. The structure including the host 2000 and the flash memory system 1000 is called a computing system.

At this point, the error correction circuit 201 of the flash memory controller 200 corrects error bits (e.g., fail data bits) among data provided from the flash memory device 100. The number of fail data bits among data provided from the flash memory device 100 is less than the reference value Ref. Additionally, the reference value Ref is the number of error bits that can be corrected in the error correction circuit 201. Accordingly, the number of the fail bit data among the data provided from the flash memory device 100 is the number that can be corrected in the error correction circuit 201. Therefore, the reference value Ref is set with respect to the number of error bits that can be corrected in the error correction circuit 201.

Consequently, the flash memory device 100 does not repeatedly perform a program loop in order to normally program a few fail bit cells. Accordingly, a program time for the flash memory device is reduced, and stress on the normally-programmed cells is also decreased. As a result, the flash memory device 100 can improve program performance.

The above-disclosed subject matter is to be considered illustrative, and not restrictive. While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device comprising:
   a memory cell array comprising a plurality of memory cells arranged in rows and columns;
   a pass/fail check circuit for verifying whether data bits selected by a column address during a column scan operation have program data values; and
   a control logic circuit for detecting fail data bits from the selected data bits and for storing the column address in response to a verification result of the pass/fail check circuit,
   wherein the control logic circuit compares a number of the fail data bits with a reference value and controls generation of the column address according to the comparison result.

2. The flash memory device of claim 1, further comprising:
   an address generator for generating the column address in response to the control logic circuit, the address generator providing the column address to the control logic circuit.

3. The flash memory device of claim 1, wherein data are programmed in the memory cell array during a program operation according to an incremental step pulse programming (ISPP) method.

4. The flash memory device of claim 3, wherein a program operation of a next program loop starts substantially simultaneously with the column scan operation.

5. The flash memory device of claim 2, wherein the control logic circuit comprises:
   a fail data bit detector for detecting the fail data bits from the selected data bits and for counting the number of the detected fail data bits;
   a program controller for controlling the address generator in response to the verification result of the pass/fail check circuit and the number of the fail data bits of the fail data bit detector; and
   an address store circuit for storing the column address provided from the address generator under control of the program controller.

6. The flash memory device of claim 5, wherein the pass/fail check circuit outputs a pass signal as the verification result when all the selected data bits are program pass.

7. The flash memory device of claim 6, wherein the memory controller controls the address generator to incrementally increase the column address in response to the pass signal.

8. The flash memory device of claim 5, wherein the pass/fail check circuit outputs a fail signal as the verification result when program fail data are detected from the selected data bits.

9. The flash memory device of claim 8, wherein the program controller controls the address store circuit to store a column address provided by the address generator in response to the fail signal during a column scan operation when a first fail signal is received from the pass/fail check circuit.

10. The flash memory device of claim 5, wherein the program controller controls the address generator to incrementally increase the column address when the number of the fail data bits is less than the predetermined reference value.

11. The flash memory device of claim 5, wherein when the number of the fail data bits is larger than the reference value, the column scan operation is stopped.

12. The flash memory device of claim 11, wherein the program controller controls the fail data bit detector to initialize the number of the fail data bits when the number of the fail data bits is larger than the reference value.

13. The flash memory device of claim 11, wherein the address store circuit provides a stored column address to the address generator when the number of the fail data bits is larger than the reference value.

14. The flash memory device of claim 13, wherein the address generator generates a column address starting from the provided column address after the program operation of a next loop.

15. The flash memory device of claim 1, wherein the reference value is based on a number of error bits that can be corrected by an error correction circuit in a flash memory controller controlling the flash memory device.

16. The flash memory device of claim 15, wherein the reference value is based on a test for cells in advance and is set below the number of error bits that can be corrected in the error correction circuit.

17. A method of programming a flash memory device comprising a memory cell array, the memory cell array including memory cells in rows and columns, the method comprising:

performing a program operation;

selecting the programmed data by a predetermined unit in response to a column address;

verifying whether all the selected data bits have program data values; and comparing a number of fail data bits among the selected data bits with a reference value, wherein generation of the column address is controlled according to at least one of the verifying result and the comparing result.

18. The method of claim 17, wherein selecting the programmed data, verifying the selected data bits, and comparing the number of the fail data bits constitute a column scan operation.

19. The method of claim 18, further comprising:

starting a program operation of a next loop together with the column scan operation.

20. The method of claim 17, wherein comparing the number of the fail data bits comprises increasing the column address when all the selected data bits have the program data values.

21. The method of claim 17, wherein comparing the number of the fail data bits comprises storing the column address when the verified result represents a first fail state.

22. The method of claim 17, wherein comparing the number of the fail data bits comprises increasing the column address when the number of the fail data bits is below the reference value.

23. The method of claim 21, wherein comparing the number of the fail data bits further comprises stopping the column scan operation and generating a column address starting from the stored column address when the number of the fail data bits is above the reference value.

24. The method of claim 23, wherein comparing the number of the fail data bits further comprises initializing the number of the fail data bits when the number of the fail data bits is larger than the reference value.

25. The method of claim 17, wherein the reference value is based on a number of error bits that can be corrected by an error correction circuit in a flash memory controller controlling the flash memory device.

* * * * *